United States Patent
Hacke

(10) Patent No.: US 6,946,725 B2
(45) Date of Patent: Sep. 20, 2005

(54) ELECTRONIC DEVICE HAVING MICROSCOPICALLY SMALL CONTACT AREAS AND METHODS FOR PRODUCING THE ELECTRONIC DEVICE

(75) Inventor: Hans-Jürgen Hacke, München (DE)

(73) Assignee: Infineon Technologies AG, Munich (DE)

(*) Notice: Subject to any disclaimer, the term of this patent is extended or adjusted under 35 U.S.C. 154(b) by 51 days.

(21) Appl. No.: 09/833,260

(22) Filed: Apr. 10, 2001

(65) Prior Publication Data

US 2001/0028102 A1 Oct. 11, 2001

(30) Foreign Application Priority Data

Apr. 10, 2000 (DE) .......................... 100 17 746

(51) Int. Cl.[7] .................. H01L 23/48; H01L 23/52; H01L 29/40
(52) U.S. Cl. ............... 257/692; 257/690; 257/735; 257/736; 257/785; 257/697
(58) Field of Search .................. 257/692, 690, 257/735, 736, 785, 697, 734, 737

(56) References Cited

U.S. PATENT DOCUMENTS

| | | | | |
|---|---|---|---|---|
| 3,825,353 A | * | 7/1974 | Loro | ...................... 317/234 R |
| 3,842,189 A | * | 10/1974 | Southgate | ................... 174/52.8 |
| 5,420,461 A | * | 5/1995 | Mallik et al. | ................ 257/734 |
| 5,476,211 A | * | 12/1995 | Khandros | ................. 228/180.5 |
| 5,476,818 A | * | 12/1995 | Yanof et al. | ................... 29/832 |
| 5,513,430 A | | 5/1996 | Yanof et al. | |
| 5,525,545 A | * | 6/1996 | Grube et al. | ................. 437/209 |
| 5,615,824 A | * | 4/1997 | Fjelstad et al. | ........... 228/180.1 |
| 5,706,174 A | | 1/1998 | Distefano | |
| 5,753,973 A | | 5/1998 | Yasunaga et al. | |
| 5,904,498 A | | 5/1999 | Fjelstad | |
| 5,917,707 A | * | 6/1999 | Khandros et al. | ............ 361/776 |
| 5,989,936 A | | 11/1999 | Smith et al. | |

FOREIGN PATENT DOCUMENTS

| | | |
|---|---|---|
| DE | 44 03 916 A1 | 9/1994 |
| DE | 197 23 203 A1 | 1/1998 |
| JP | 04 010 543 A | 1/1992 |
| JP | 05 175 199 A | 7/1993 |
| WO | WO 96/14659 | 5/1996 |

\* cited by examiner

*Primary Examiner*—Nitin Parekh
(74) *Attorney, Agent, or Firm*—Laurence A. Greenberg; Werner H. Stemer; Ralph E. Locher

(57) ABSTRACT

An electronic device and a method for producing the electronic device which has at least one microscopically small contact area for an electronic circuit having interconnects that are on a surface of a substrate. A three-dimensionally extending microscopically small contact element is integrally one-piece connected to the contact area.

19 Claims, 6 Drawing Sheets

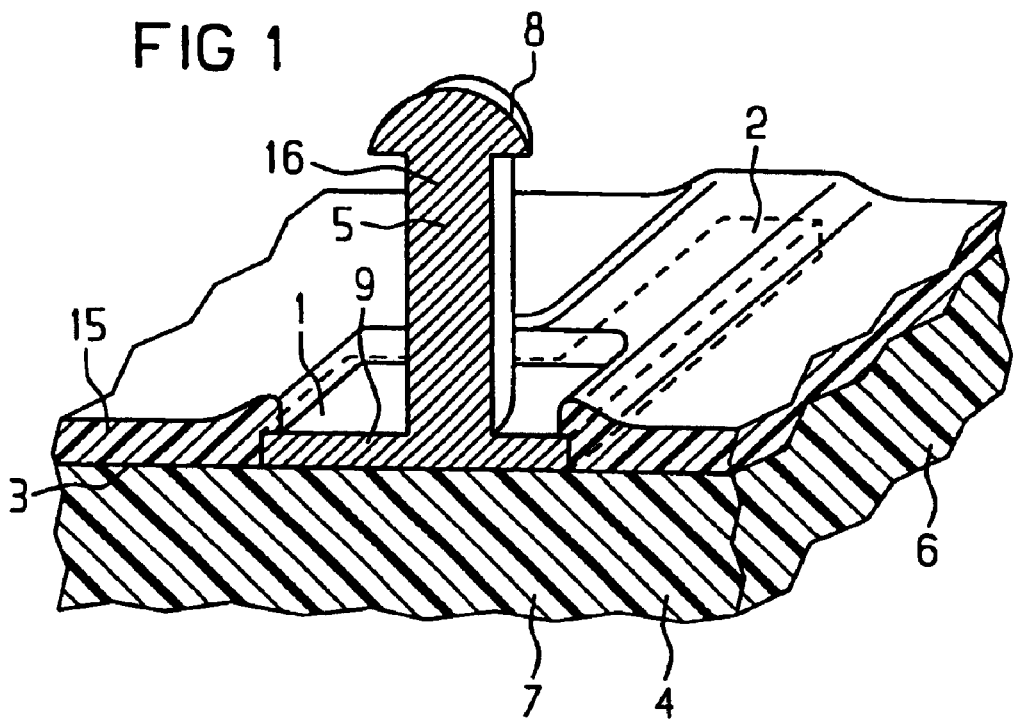
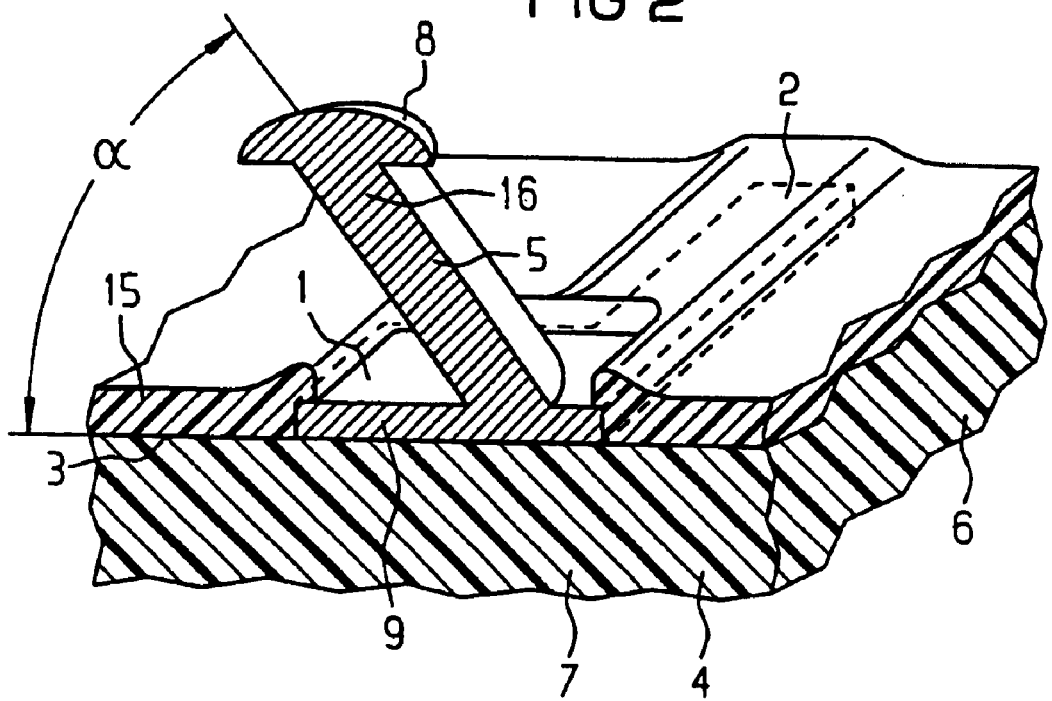

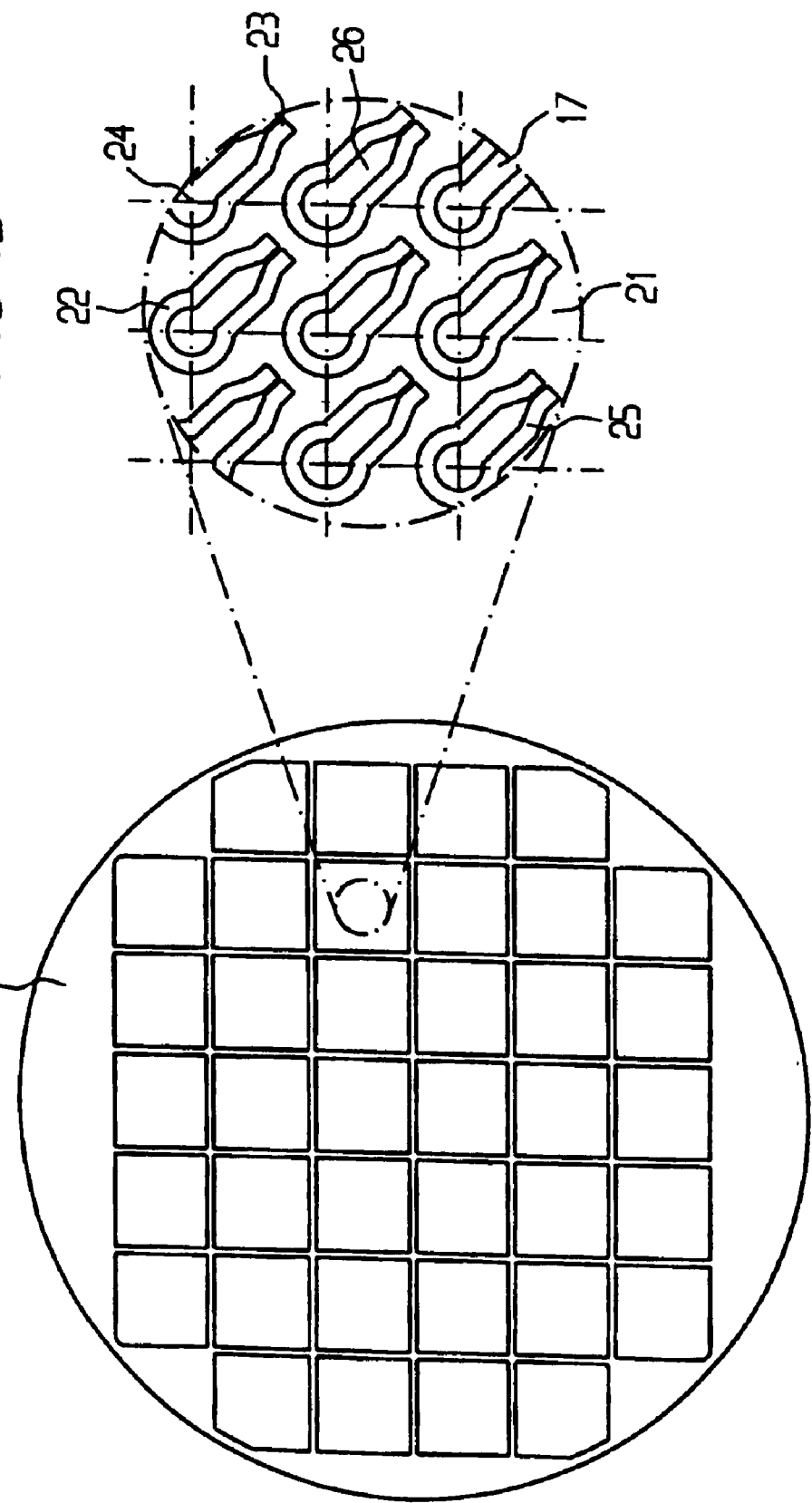

ELECTRONIC DEVICE HAVING MICROSCOPICALLY SMALL CONTACT AREAS AND METHODS FOR PRODUCING THE ELECTRONIC DEVICE

BACKGROUND OF THE INVENTION

Field of the Invention

The invention relates to an electronic device having microscopically small contact areas and a method for producing it.

In the course of miniaturization of IC housings, housing packages have been disclosed which are the same size as the semiconductor chips of a semiconductor substrate or are only insignificantly larger than the semiconductor chips. They are called CSP housings (Chip Size Packages). On the semiconductor chip itself there are arranged microscopically small contact areas, which are usually arranged in a central row or in the edge region of the semiconductor chip, microscopically small meaning that the structure can be discerned and measured under a light microscope. Although rewiring from the central or edge region distribution of the microscopically small contact areas to the outwardly leading external connections that are distributed in rows and/or columns over the entire area of the extensive housing of the electronic device can be effected in different ways, expansion compensation between the expansion of the semiconductor chip and of an intermediate carrier which carries the rewiring and the external connections must be made possible. In order to further reduce the production costs for such extensive housings, the aim is for the realization already to be implemented, with great effectiveness, at the wafer level. In this case, the term wafer level CSP housing is used.

There are numerous possibilities for carrying out the rewiring at the wafer level and using a relatively thick dielectric instead of an intermediate carrier, the rewiring being carried out by means of thin-film wiring.

In order to carry out a test of the electronic circuits on the wafer, a method is known in which a wire connection is successively placed as first bond on each unwired chip connection by means of thermocompression bonding. This wire connection is then severed, and the wire stubs are electroplated with spring-tempered material to produce elastic contact tips which can be used to make contact for electrical testing and for burn-in.

Such a sequential production of test connections by way of wire stubs that are subsequently electroplated for producing elastic contact tips made of spring-tempered material is extremely cost-intensive and cannot be realized directly on the microscopically small contact areas, but rather only after rewiring via interconnects that bring about the expansion compensation, and after the production of the outwardly led connections arranged in rows and columns.

SUMMARY OF THE INVENTION

It is an object of the invention to specify an electronic component having at least one microscopically small contact area and a method for producing it which overcomes the disadvantages in the prior art and makes it possible to simultaneously produce a multiplicity of contacts which are suitable both for compensating areal unevennesses and for enabling expansion compensation in the event of thermal cycling of an electronic device.

To that end, the electronic device comprises a contact area which additionally has a three-dimensionally extending microscopically small contact element which is connected to the contact area in one piece and integrally.

This electronic device has the advantage that its contact area with the three-dimensionally extending microscopically small contact element can be realized simultaneously for a multiplicity of integrated circuits on a wafer. Furthermore, this electronic device has the advantage that, for test purposes, a test head with correspondingly arranged contact connection areas on an intermediate carrier can simultaneously make contact with the three-dimensionally extending microscopically small contact elements, without a bonded connection already having to be produced. As a result, it is advantageously possible to test the electronic devices still prior to encapsulation in a plastic housing directly on a wafer without rewiring and intermediate carrier.

Finally, the electronic device according to the invention, with its contact areas which additionally carry a three-dimensionally extending microscopically small contact element, can compensate all expansion differences between the electronic circuit having interconnects on the surface of a substrate or semiconductor and the intermediate carrier belonging to the housing. This avoids conventional form-flexible contact connection lugs between microscopically small contact areas on the surface of the substrate and contact connection areas on an intermediate carrier. Furthermore, this electronic device has the advantage that the three-dimensionally extending microscopically small contact elements can compensate unevennesses of the surface of the substrate. Finally, it is also possible to compensate for tolerances of a distance between the surface of the substrate and the contact connection areas arranged on the surface of an intermediate carrier, by virtue of the three-dimensionally extending microscopically small contact pins.

In a preferred embodiment of the invention, in the electronic device, a contact connection area of an intermediate carrier with flat conductors is arranged opposite the contact area. In the course of rewiring, such flat conductors distribute the microscopically small contact areas arranged on the edge regions of the surface of the substrate, or the microscopically small contact areas arranged in a row through the center of the surface of the substrate, over the entire area of the electronic device and provide a connection to corresponding outwardly led electrical connections of the electronic device. The outwardly led electrical connections are, for example, contact bumps distributed in rows and/or columns on the extensive housing of the electronic device. In a preferred embodiment of the invention, the substrate is a semiconductor chip or a semiconductor wafer, and the electronic circuit is at least one integrated circuit in that region of the semiconductor chip or of the semiconductor wafer which is near the surface.

On account of the invention's design of the electronic device with contact areas which have a three-dimensionally extending microscopically small contact element which is connected to the contact area in one piece and integrally, it is advantageously possible to equip all contact areas of a semiconductor chip with contact elements of this type and/or to populate an entire semiconductor wafer with a multiplicity of electronic circuits and a multiplicity of contact areas with these contact elements simultaneously in one production method and thus to use the contact elements not only for expansion compensation or for compensating unevennesses in the course of rewiring to electronic external connections, but rather to utilize the contact elements in order to check the function of the electronic circuit still prior to encapsulation of the electronic devices with housings and still prior to separation of a semiconductor wafer into individual electronic devices.

In a further preferred embodiment of the invention, the electronic circuit with interconnects has a multiplicity of contact areas which are each arranged on an end of the interconnects. These interconnects situated on the surface of the substrate serve for connection between contact areas and the electrodes of the active and passive components of the electronic circuit in that region of the substrate which is near the surface, and, unlike the flat conductors on an intermediate carrier, do not have the task of realizing rewiring.

In a preferred embodiment of the invention, the contact element has not only plastic deformability, which is given for each metal, but also elastic deformability, with the result that an advantageous spring stiffness of the contact pin is available.

In a further preferred embodiment of the invention, the contact element is preformed at a solid angle which deviates from the orthogonal orientation. Such an inclined orientation of the contact element relative to the contact area has the advantage of facilitating elastic adaptation to unevennesses of the surface of the substrate and plastic expansion compensation, since the microscopically small contact elements are already preformed at a corresponding solid angle.

In a further preferred embodiment of the invention, the contact element is prebent at a solid angle which deviates from the orthogonal orientation. In this preferred embodiment, the microscopically small contact element firstly extends in the orthogonal direction and is plastically deformed using a tool, with the result that it is permanently bent and, in this prebent form, is available for the various further requirements made of the electronic device.

The length of the contact element can be adapted to the wide variety of requirements which are imposed on the electronic device. Thus, preferably the length of the contact element is at least 5% greater than the largest bulging of the surface of the substrate, which advantageously ensures that even the largest bulging of the surface of the substrate can be compensated by the contact pin. Furthermore, the length of the contact element may be at least 5% greater than the largest distance between contact area and contact connection area, in order to ensure that the contact element reliably bridges even the largest distance between the contact area and an opposite contact connection area, preferably of an intermediate carrier or of a test head.

Finally, the length of the contact element may be at least 5% greater than the largest length difference with regard to the centrally located neutral point of the substrate in the event of maximum thermal cycling. In the case of this preferred embodiment, it is additionally ensured that, for all instances of thermal cycling, the length of the contact element suffices to ensure expansion compensation for the different external dimensions of the substrate and the thermal cycling.

Furthermore, the length of the contact element may be at least 5% greater than the largest length difference between substrate and intermediate carrier relative to the centrally located neutral point of the substrate in the event of maximum thermal cycling. This advantageously also enables expansion compensation taking account of the different thermal expansion of substrate material and intermediate carrier material by means of the adapted length of the contact element.

Preferably, the contact area and the contact element are produced from an identical metal alloy. This embodiment has the advantage that no diffusion area layers at all have to be provided in order to avoid electromigration and other material migration at the junction between contact area and contact element. However, this embodiment cannot be implemented for all customary contact area materials.

Therefore, in a further preferred embodiment of the invention, the contact area is produced from an aluminum alloy, while the contact element is produced from a gold alloy. This combination has the advantage that it provides a high-quality, non-oxidizing contact element which additionally has the advantage that its free end can enter into intermetallic compounds, with isothermal solidification, with a contact connection area made of an aluminum alloy and, consequently, the contact pin can be connected to the rewiring that leads further.

In a further preferred embodiment of the invention, the contact areas are made of an aluminum alloy and the contact element is made of a copper alloy. This has the advantage that, in order to further connect the contact pin to the rewiring of an intermediate carrier, conventional connection technologies which work with copper alloys can directly be used.

In a preferred embodiment of the invention, the microscopically small contact elements are designed as microscopically small contact pins. These contact pins are preferably mushroom-shaped and bear a rounded mushroom-cap-shaped contact head. The contact pins are preferably arranged simultaneously on a semiconductor wafer with the contact areas as integral one-piece element by means of specially adapted method steps appertaining to planar technology.

In a further preferred embodiment of the invention, the contact pin has a diameter which is less than or equal to half the shortest linear dimension of the contact area. In this case, the contact area may be of rectangular, circular or elliptical design, and the restriction of the diameter of the contact pin to the preferred magnitude less than or equal to half the shortest linear dimension of the contact area advantageously serves to impart to the three-dimensionally extending microscopically small contact pin, over a relatively large contact connection area, sufficient adhesion on the surface of the substrate in order that elastic bending and plastic deformations of the microscopically small contact pin become possible without the one-piece integral component comprising contact area and contact pin lifting off from the surface of the substrate or even tearing off from the adjoining interconnects.

In a further preferred embodiment, the contact pin has a contact head on its end which is remote from the contact area. As a result, the contact pin acquires a mushroom-shaped configuration as an integral part of the contact area. This mushroom-shaped configuration has the advantage that sliding relative to the contact connection areas of an intermediate carrier is facilitated, and that, for fixed connections between the rewiring of an intermediate carrier and the contact pins, the material of the contact head can be adapted to the material properties of the contact connection area to which the contact head is connected.

The contact head of the contact pin may be produced from the same metal alloy as the contact pin and, for the various applications, may additionally have either a coating made of nickel and/or gold or a solderable metal alloy coating, or the entire contact head may possibly be composed of solder. This embodiment of the contact head, in particular the optimal choice of material for the contact head, depends on the construction of the housing of the electronic device. If only a pressure contact is demanded for the rewiring, a friction-and oxidation-resistant coating of nickel or gold on the contact head will certainly be advantageous. However, if a bonded connection is required, then this essentially depends on the eutectic melts which can be formed between the material combinations comprising contact head and rewiring that leads further. Finally, if the aim is to effect a soldered connection preferably for the contact head, if external connections such as contact bumps made of soldering balls are also to be produced, then it is advantageously possible to use a single burn-in process to produce both the connection of the rewiring to the external contact bumps and the internal soldered connection between contact head and rewiring for an electronic device.

In a further preferred embodiment of the invention, the microscopically small contact elements are designed as microscopically small contact springs having a leaf-spring-like configuration, one end of the contact spring being integrally connected to the contact areas of the substrate or of the semiconductor chip, and the other end extending three-dimensionally from the contact area. The width of the contact spring toward the free end is preferably tapered in such a way that a virtually square contact area of the contact leaf spring is arranged in a three-dimensionally offset manner above the connection to the contact area of the substrate or semiconductor chip.

The contact springs are preferably produced by means of synchronous method steps for all the contact springs of a wafer simultaneously by means of multiple bonding or diffusion soldering from a patterned metal sheet, the three-dimensionally extending elastic contact springs with their free-standing contact area ends being formed at prepared desired breaking points in the structures of the metal sheet during the lifting-off of the metal sheet from the bonded or diffusion-soldered points.

The contact spring preferably extends with its free end at a solid angle α which is smaller than the orthogonal with respect to the contact area. Such a contact spring which is angled with respect to the contact area has the advantage that, by means of its free-standing ends, surface unevennesses between a measuring head with multiple contact connection areas for measuring the function of the semiconductor chip can be compensated more easily by elastic deformation and, during the packaging of the semiconductor chip, contact to the multiple contact connection areas of an intermediate carrier can be produced more easily since surface unevennesses between semiconductor chip and intermediate carrier can be compensated.

In a further preferred embodiment of the invention, the width of the contact leaf springs corresponds to the width of the contact areas on a substrate or semiconductor chip. This has the advantage that during bonding, the entire contact area on the semiconductor chip is available for the one-piece integral connection of contact area and contact spring and, as a result, an intensive, stable connection with a large area on a microscopic order of magnitude can be constructed.

In a further preferred embodiment of the invention, the contact spring is provided with gold and/or with a nickel coating at its free end. In this case, the nickel coating serves as a diffusion-inhibiting layer between the material of the contact spring and the gold coating in order to ensure that the contact spring material does not diffuse through as far as the material of the contact area on the semiconductor chip.

The metal sheet is preferably made of an elastic material such as a spring bronze or a copper alloy, with the result that leaf-spring-like contact springs are directly produced when the metal sheet is stripped off from the substrate or a semiconductor wafer. In a further preferred embodiment of the invention, however, it is also possible to use a soft-annealed sheet of spring bronze which then attains its spring stiffness by means of heat treatment of the wafer or of the semiconductor chip after the residual sheet has been lifted off from the substrate or a semiconductor wafer.

A metal sheet made of spring-elastic material is preferably used, which is selectively soft-annealed preferably by means of a laser beam in the region where the contact spring bends to the greatest extent, in order advantageously to prevent the contact spring from being torn off from the contact area of the substrate, or to avoid damage to the contact connection area, by virtue of the fact that small bending forces have to act on the connection between contact spring end and contact area. In this case, too, the spring stiffness of the contact spring is established after bonding by means of subsequent heat treatment.

A method for producing an electronic device having at least one microscopically small contact area for an electronic circuit having interconnects on a surface of a substrate, the contact area additionally having a three-dimensionally extending microscopically small contact element which is connected to the contact area in one piece and integrally, comprises the following method steps:

a) Patterning of a conductive layer on a surface of a substrate to form interconnects and microscopically small contact areas, b) Application of a passivation layer to the patterned conductive layer, c) Opening of contact windows in the passivation layer in order to uncover the contact areas, d) Application of a closed conductive layer in order to connect the contact areas, e) Application of a masking layer to the closed conductive layer, f) Patterning of the masking layer with through openings to the contact areas, g) Filling of the through openings with conductive material, h) Removal of the masking layer, i) Removal of the closed conductive layer.

These method steps according to the invention make it possible for there to be produced, directly on the microscopically small contact areas, in addition three-dimensionally extending microscopically small contact pins and/or contact springs as contact elements which are connected to the contact areas in one piece and integrally. This method furthermore has the advantage that by varying the thickness of the masking layer during application to the closed conductive layer, it is possible simultaneously to vary the length for all the contact elements. The thicker the masking layer is applied, the longer the contact elements that are being formed become, since the through openings, which are finally filled with conductive material and form the contact elements, have a length which is governed by the thickness of the masking layer.

The masking layer itself is an essential aid for producing contact elements which are connected to the contact area in one piece and integrally, and is removed again in a concluding method step. Moreover, the application of a closed conductive layer after interconnects have already been patterned on the surface of the substrate serves merely to short-circuit all the microscopically small contact areas in order to enable, for example, electrodeposition of metal from the closed conductive layer through the through openings. After electrodeposition of conductive material to fill the through openings and after removal of the masking layer, the short circuit between the contact areas can also be cancelled by removing the closed conductive layer.

The patterning of a conductive layer is preferably effected by means of photolithography. The application of a passivation layer, preferably made of $Si_3N_4$, is carried out by means of sputtering technology. The opening of windows to the contact areas may again be effected by means of photolithography. The application of a closed conductive layer may preferably be effected by means of vapor deposition technology, sputtering technology or deposition technology. The patterning of a conductive layer, the application of a passivation layer, the opening of windows to the contact areas and also the subsequent application of a closed conductive layer may be effected simultaneously for a multiplicity of electronic devices and directly on a substrate or semiconductor wafer in order thus to form the precondition for simultaneously producing a multiplicity of contact elements on a multiplicity of contact areas.

To subsequently fill a through opening to a contact pin by electrodeposition, a closed conductive layer is preferably produced from a copper alloy. For electroless deposition of the contact element material on the surface of the contact areas in the through openings of the masking layer, it is possible, in another preferred embodiment of the invention, to dispense with the application of a closed conductive layer since it is not necessary to short-circuit all the contact areas in the case of electroless metal deposition. However, electroless deposition methods are often not selective enough, with the result that a relatively thick deposited conductive layer may be produced on the masking layer at the same time as the through openings are filled.

The masking layer itself is preferably applied by means of spinning on, spraying on or by means of an immersion technology. In a preferred implementation of the invention, for the formation of through openings, the masking layer may be composed of a photosensitive dielectric, such as preferably of a viscous photoresist whose viscosity can be adapted to the requirements for the electronic device depending on the required length of the contact element and thus in accordance with the required thickness of the masking layer. For selective precuring of the photosensitive dielectric, the masking layer is preferably covered by means of a mask that is blackened at the positions of the contact elements or of the through openings to be developed, and the remainder of the masking layer made of photosensitive dielectric is exposed.

In a subsequent development step, the unexposed region of the photosensitive dielectric layer is dissolved out, thereby producing through openings to the closed conductive layer in the region of the contact areas on the surface of the substrate during development. However, such through openings may also preferably be produced in a resin layer by means of laser removal technology, ion beam sputtering or plasma etching, in particular if the required length of the contact elements exceeds the exposable thickness of photosensitive dielectrics. The advantage of resin layers in conjunction with laser removal technology, ion beam sputtering or plasma etching is that said masking layer made of resin can be applied in any desired thickness and can be produced with through openings.

After the through openings have been made in the masking layer, the through openings are preferably filled with conductive material by means of electrodeposition. To that end, in a corresponding electrodeposition bath, the closed conductive layer is put at cathode potential and an electrode made of the material of the contact elements to be formed is connected to the anode potential, with the result that the anode material is removed via metal ion exchange and a contact element made of metal grows on contact areas in the through openings.

When the masking layer is removed, a three-dimensionally extending microscopic small contact element which is connected to the underlying contact area in one piece and integrally is produced at the position of each filled through opening. The removal of the closed conductive layer can be effected by means of etching technology only if the masking layer has been completely removed beforehand.

After the removal of the masking layer and of the closed conductive layer, the contact element can move freely with its free end, and it can bend elastically and plastically with a change in its solid angle, with the result that it is advantageously possible for the three-dimensionally extending contact element to bridge different distances and unevennesses and to compensate different expansions.

Furthermore, with the method specified above, it is possible, after the filling of the through openings, to carry out a further deposition on the masking layer in order to produce a mushroom-cap-like outgrowth on the tip of the contact element, with the result that a contact head is preferably formed by means of electrodeposition. This contact head can additionally be refined by deposition preferably of a relatively noble contact surface coating made preferably of a nickel and/or gold layer.

The masking layer can also readily be removed after formation of a contact head, by the masking layer being dissolved in suitable solvents. Another preferred method for dissolution of the masking layer is incineration by means of plasma technology.

A wafer whose contact areas are equipped with such three-dimensionally extending contact elements can directly be tested at the wafer level, still prior to separation into individual semiconductor chips or into individual electronic devices, by a test head being used to press an intermediate carrier with contact connection areas onto the contact elements of an integrated circuit of an individual electronic device in order to check the functionality of the electronic circuit of the electronic device. Such test heads with a corresponding number of contact connection areas on an intermediate carrier material simplify the hitherto customary functional testing before, during and after burn-in. Furthermore, the microscopically small three-dimensionally extending contact elements on the wafer can be used for being connected with a large-area intermediate carrier for rewiring the contact areas with connections passing out of a housing. In this case, the intermediate carrier may have the same dimensions as the wafer and, opposite each contact area on the surface of the wafer, have a contact connection area which is connected via flat conductors to the outwardly led connections of the electronic device.

In order to achieve reliable simultaneous soldering or ultrasonic bonding of the multiplicity of contact elements to the contact connection areas of the intermediate carrier, the interspaces between the contact elements are preferably potted by means of spraying technology or injection-molding technology, and, if necessary, the contact heads are subsequently uncovered after the potting of the interspaces, with the result that the positions of the contact heads relative to the contact connection areas of the intermediate carrier are stabilized by means of these method steps. By means of a corresponding contact pressure and a thermal treatment or corresponding frictional heating using ultrasound, it is subsequently possible to effect either a soldered connection by means of a contact head made of solder or a connection by means of ultrasonic bonding of all the contact heads of a wafer simultaneously to the contact connection areas of an intermediate carrier.

The choice of correspondingly elastic and plastically deformable injection-molding compounds in the interspaces between the contact elements makes it possible to compensate unevennesses of the surface of the substrate and the surface of the intermediate carrier, and to realize a housing technology at the wafer level, with the result that, with the simultaneous division of the wafer with the connected intermediate carrier with rewiring and external connections, the wafer with its multiplicity of integrated circuits can efficiently be separated into electronic devices.

In the preferred implementation of the method, the patterned conductive layer, the contact elements and the contact heads are produced from a material which has already been discussed above for the individual applications.

A further method for producing an electronic device having at least one microscopically small contact area for an electronic circuit having interconnects on a surface of a substrate, the contact area additionally having a three-dimensionally extending microscopically small contact element which is connected to the contact area in one piece and integrally, comprises the following method steps:

a) Patterning of a metal sheet preferably made of a copper alloy with patterns, the structure having a multiplicity of etched-free contours of contact springs which are connected to the metal sheet by a desired breaking point, the uncovered end of the contact spring contour corresponding in size, arrangement and position to the contact areas of a substrate, b) Alignment and pressing of the patterned metal sheet onto a substrate with a multiplicity of contact areas, the uncovered ends of the contact spring contours being pressed onto the contact areas, c) Heating of the metal sheet and of the substrate for the purpose of bonding the uncovered ends of the contact spring contours to the contact areas, d) Cooling and stripping-off of the metal sheet, leaving behind three-dimensionally extending, bonded contact springs on each of the contact areas.

This method advantageously produces microscopically small contact springs which extend three-dimensionally from contact areas on a substrate, the contact springs being connected to the contact areas in one piece and integrally. In this case, the simultaneous formation of contact springs is not limited in terms of numbers, with the result that a multiplicity of contact springs can advantageously be formed simultaneously using this method.

The contact springs on the contact areas have the advantage that they lengthen the contact areas three-dimensionally, with the result that subsequent components, for example of a housing of an electronic device, can be placed onto these resilient connections or be soldered to the uncovered ends of the contact springs or be bonded to them. The spring action of these contact springs makes it possible to compensate unevennesses in the plane of the contact areas and unevennesses in the plane of contact connection areas of an adjoining intermediate carrier of a housing.

Furthermore, it is possible, directly after the production of the integrated circuits on a semiconductor wafer, to test these circuits with their multiple contact areas by means of a test head with correspondingly arranged contact connection areas, which is simply placed onto the free ends of the contact springs by its contact connection areas and can then test the functionality of each individual integrated circuit. During this test, the contact springs compensate differences in distance between the test head and the substrate and ensure that a resilient frictional contact with the contact connection areas of the test head can be established. The patterning of a metal sheet with contact spring contours is preferably carried out by means of an etching technology. To that end, the metal sheet is covered with a protective layer in the regions that are not to be etched. This covering can be effected by means of photoresist technology, screen-printing technology or stencil masking technology.

In another preferred implementation of the patterning, the contours of the contact springs are introduced into the metal sheet by means of laser removal technology. Dry etching methods such as plasma etching are also suitable for introducing the contact spring contours into a metal sheet.

In a preferred implementation of the method, the uncovered ends of the contact spring contours are coated with a nickel and/or a gold layer before being pressed onto the contact areas of a substrate. This coating has the advantage that, in particular, the gold layer forms intermetallic phases, with isothermal solidification, with the contact areas made, preferably, of an aluminum alloy, said phases ensuring a high temperature resistance of the compound.

In a further preferred implementation of the method, the contact spring contours are coated with a solderable metal alloy in the region of the desired breaking points. This selective metal coating has the advantage that after the desired breaking points have been torn, the contact connection areas formed have a solder coating which is suitable for connection to adjoining contact connection areas.

In a further preferred implementation of the method, a spring-elastic material having a thickness between 30 and 100 $\mu$m is used as the metal sheet, which material is additionally provided with a tin layer. This has the advantage that, after the patterning of the metal sheet, the contact spring contours are already provided with a tin layer which enables a soldered connection to the contact areas.

In a further preferred implementation of the invention, before the pressing-on of the metal sheet, the contact spring contours are soft-annealed in predetermined regions, preferably in their central region. This method has the advantage that, during the subsequent stripping-off of the metal sheet from the substrate, the force on the contact area is minimized and the bending-over of the contact spring into a three-dimensional extent of its free end only minimally loads the contact areas and the connection between contact areas and contact springs. The soft-annealing of the metal sheet made of spring-elastic material in the central region of the contact spring contours may preferably be effected by laser scanning over the corresponding regions.

In a further preferred implementation of the method, the metal sheet used is a soft material such as a soft copper alloy, after the metal sheet has been stripped off, the residual three-dimensionally extending contact structures being heat-treated to desired spring properties of the contact springs. In the case of this method variant, the actual spring force is produced only after the connection to the contact area and/or the shaping of the contact spring are concluded. In the case of this method variant, the connection between contact spring and contact area is loaded the least in the case of the shaping.

The invention is explained in more detail using exemplary embodiments together with the accompanying drawings.

BRIEF DESCRIPTION OF THE DRAWINGS

FIG. 1 shows a partial cross-sectional perspective view of a first embodiment of the invention with a contact pin extending orthogonally in a three-dimensional manner from a contact area.

FIG. 2 shows a partial cross-sectional perspective view of a second embodiment of the invention with a contact pin that is preformed at a solid angle which deviates from the orthogonal orientation.

FIG. 12 shows a plan view of a metal sheet patterned with contact spring contours.

FIG. 13 shows an enlarged detail from FIG. 12.

DESCRIPTION OF THE PREFERRED EMBODIMENTS

Figure 3:
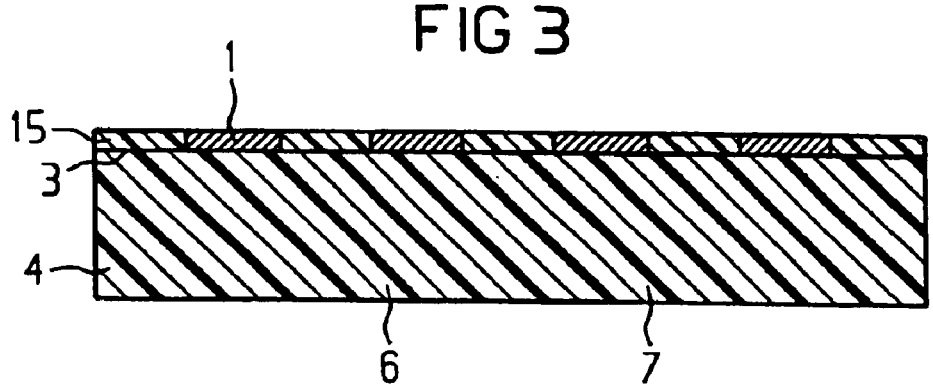
FIGS. 3 to 9 show preferred method steps of an implementation of a method of the invention using cross sections through an electronic device.

FIG. 1 shows a partial cross-sectional perspective view of a first embodiment of the invention with a contact element 5 extending orthogonally in a three-dimensional manner from a contact area 1 and having the form of a contact pin 16. This three-dimensionally extending contact pin 16 has a microscopically small length and has a contact head 8 in this embodiment. The microscopically small contact area 1 is part of an electronic circuit having interconnects 2 on a surface 3 of a substrate 4. In this embodiment, the interconnects 2 and the contact area 1 are composed of an aluminum alloy, while the contact pin 16 has a copper alloy which also forms the contact head 8, the surface of the contact head 8 being refined with a nickel and a gold coating.

Electronic devices of this type have the advantage that unevennesses of the surface 3 of the substrate 4 can be compensated over the length of the contact pins 16, by virtue of the fact that the contact pin 16 can match the unevennesses by bending under plastic and elastic forces. This is particularly advantageous if the contact pin 16 is intended to serve for testing the function of an electronic device on a wafer before the wafer is separated into individual electronic devices or semiconductor chips having an integrated circuit by means of a separation technique. To that end, a test head having contact connection areas which are held by an intermediate carrier and are arranged spatially opposite the contact areas may be pressed onto the contact heads 8 of the contact pins 16, the contact pressure compensating the unevennesses of the substrate 4 and of the intermediate carrier and hence the different distances between the two.

FIG. 2 shows a partial cross-sectional perspective view of a second embodiment of the invention with a contact element 5 that is preformed at a solid angle α, which deviates from the orthogonal orientation. This pin-like contact on the contact area 1 obliquely to the substrate surface allows tolerance-noncritical contact-making for test purposes both in the wafer format and in the component format. This embodiment of the invention is tolerance-noncritical because the inclination of the contact pin 16 and its deviation from the orthogonal orientation allow a certain spring action and, as a result, height differences can be compensated.

Furthermore, the lateral movement of the obliquely arranged contact pin 16 of FIG. 2 which is triggered when pressure is exerted is also particularly advantageous. The movement contributes to reliable contact-making as a result of the contact point rubbing freely on an opposite contact connection area (not shown) of an intermediate carrier.

The contact pin 16 of FIG. 1 or FIG. 2 can be used not just for testing technology with regard to the functionality of an individual electronic device but also for connecting the contact area 1 to a contact connection area of an intermediate carrier which carries a rewiring to external connections of the housing. In this case, the intermediate carrier is part of a housing for packaging the electronic devices. On this intermediate carrier, rewiring from the contact connection areas to external connections distributed on the entire area of the intermediate carrier is performed via flat conductors. In order to stabilize the position of the contact pin 16 during the connection of the contact pin 16 to a contact connection area (not shown) of an intermediate carrier, the interspace between a multiplicity of contact pins 16 can be filled by an elastic potting compound 13, preferably made of silicone, as is shown in cross section by FIG. 10, for example.

FIGS. 3 to 9 show preferred method steps of an implementation of a method of the invention using cross sections through an electronic device.

Figure 4:
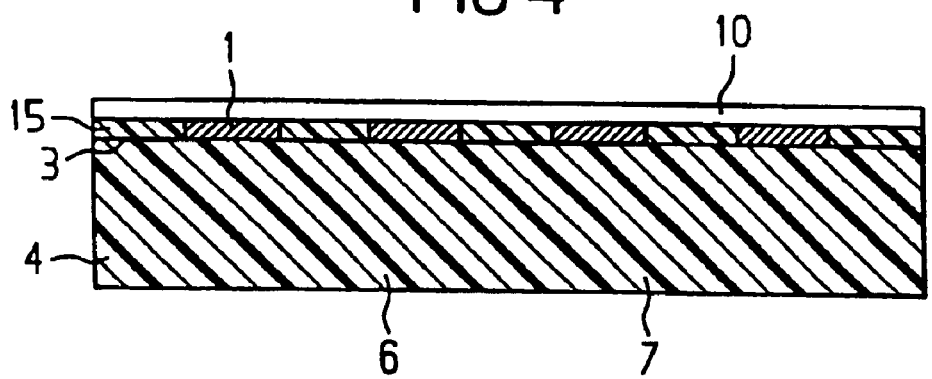

In FIG. 3, a patterned metal layer with passivation layer 15 and uncovered contact areas 1 is applied on the surface 3 of a substrate 4. This patterning of the metal layer and the uncovering of the contact areas 1 may preferably be effected by means of photoresist technology of a closed conductive layer or of a closed passivation layer 15 made of $SI_3N_4$. As is shown by FIG. 4, a closed conductive layer 10 is applied to this passivation layer 15 with uncovered contact areas 1. The layer 10 short-circuits all the contact areas 1.

Figure 5:
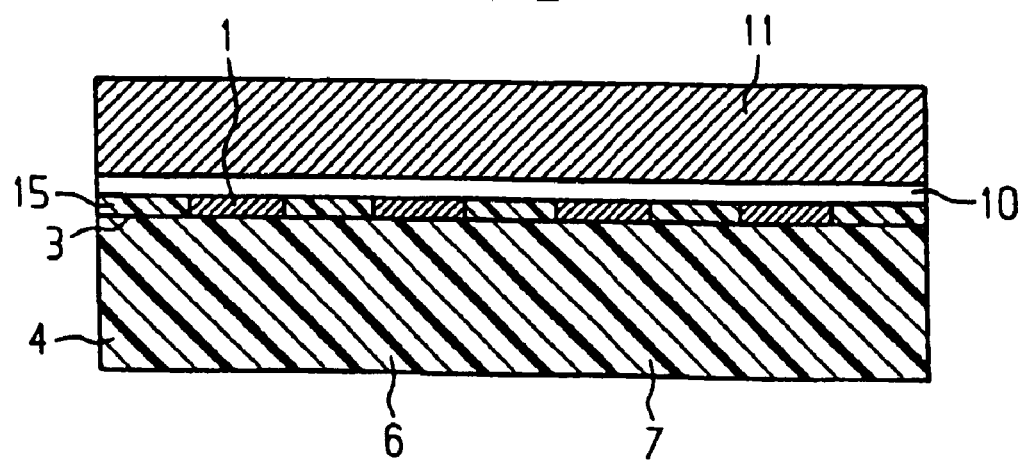
Figure 6:
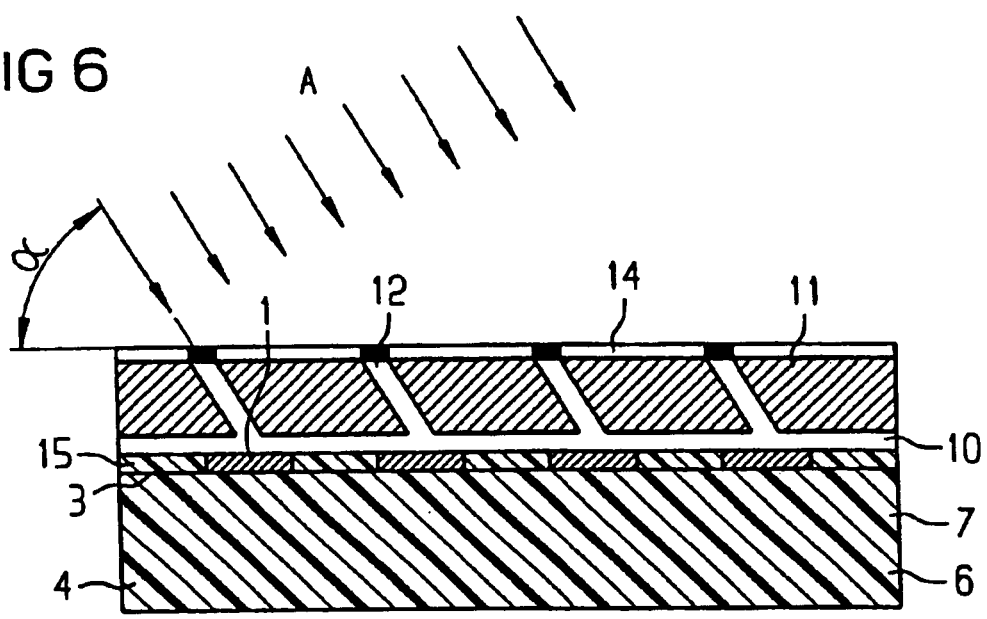

After the application of the closed conductive layer, a masking layer 11 is applied to the closed conductive layer 10 by means of spinning on, spraying on or by means of immersion technology. In this implementation of the method, a photosensitive dielectric is applied as masking layer 11, which is shown in FIG. 5. A photomask 14 is placed over the dielectric, as can be seen in FIG. 6. At a solid angle α, with parallel light irradiation, the photoelectric dielectric is exposed in the regions in which the photomask 14 is not blackened, with the result that these regions of the photosensitive dielectric are precrosslinked and the precrosslinked exposed regions remain during the subsequent development process, while through openings 12 are formed from the surface of the masking layer 11 to the closed conductive layer 10 during the subsequent development process of the photosensitive dielectric.

Figure 7:
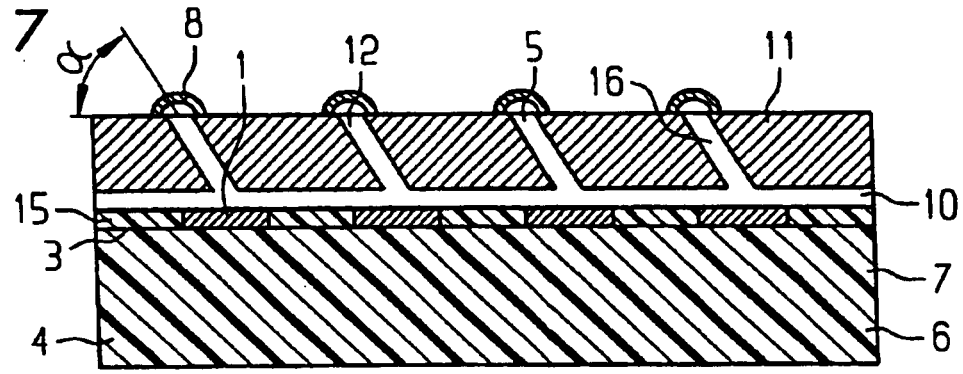

As shown by FIG. 7, the through openings 12 are filled with metal by means of electrodeposition, thereby producing a three-dimensionally extending microscopically small contact element 5 which is connected to the contact area 1 in one piece and integrally. In the embodiment as shown by FIG. 7, the closed conductive layer 10 is made of a copper alloy and an electrodeposited contact pin 16 has a contact head 8 that is made of an adapted copper alloy. The contact head 8, after being formed, is refined by coating with nickel and a gold coating which are likewise electrodeposited.

Figure 8:
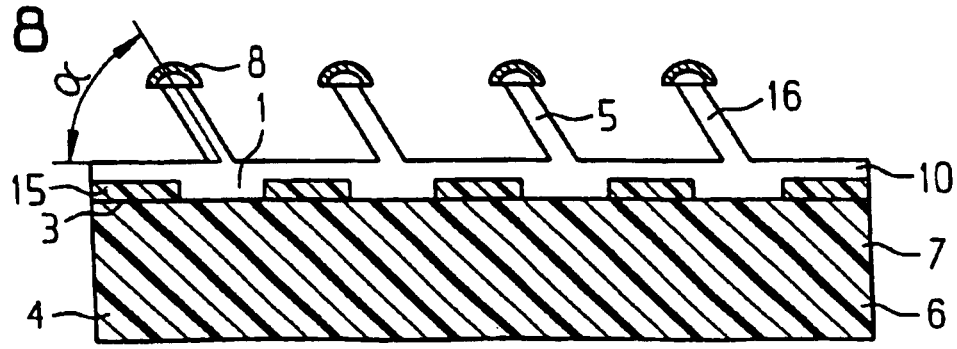
Figure 9:
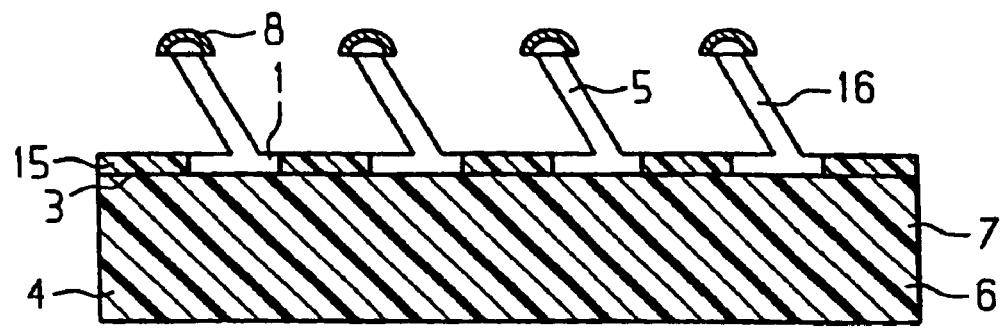

After the production of contact pin (16) and contact head (8) by electrodeposition, the masking layer (11) is removed, and a structure as shown in cross section in FIG. 8 remains. The thin closed conductive layer 10 is then briefly etched, leaving behind the structure (shown in FIG. 9) with freestanding microscopically small contact pins 16 which are connected to corresponding contact areas 1 in one piece and integrally. These contact pins 16 can be produced simultaneously on an entire wafer surface and are thus available for making contact with a test head in order to test the functionality of the electronic devices before the substrate 4 is separated into electronic devices.

Figure 10:
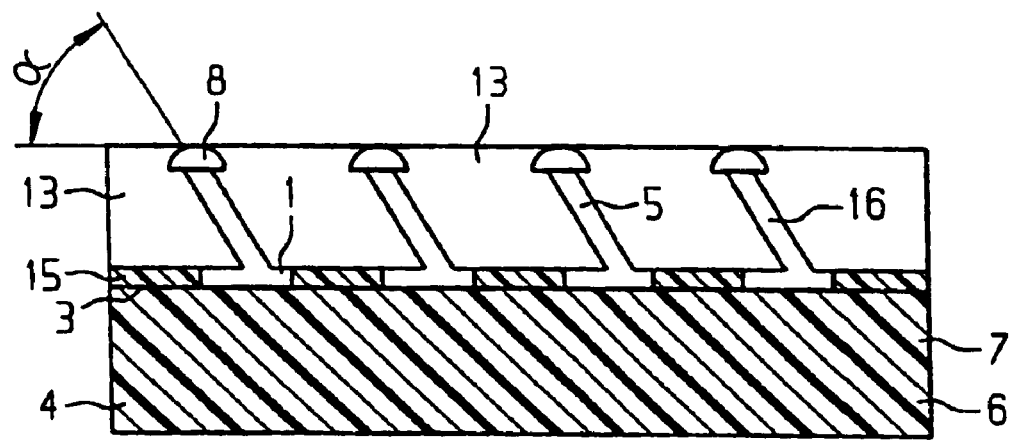
FIG. 10 shows a cross section through a preferred embodiment of an electronic device after potting of the interspaces between a multiplicity of contact pins.
Figure 11:
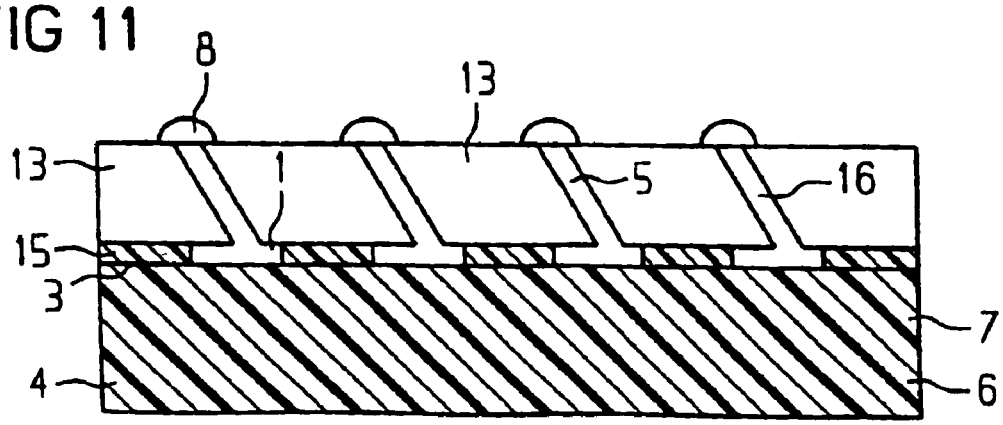
FIG. 11 shows a cross section through a preferred embodiment of an electronic device after the contact heads have been uncovered.

Afterward, the contact pins 16 with their heads 8 may be enclosed in a potting compound made, preferably, of silicone, in order to stabilize and to support the contact pins 16, as is shown in FIG. 10. During the potting process, however, as shown by FIG. 10, the contact heads 8 may be covered by the potting compound, so that, in a further step, the contact heads 8 are uncovered preferably by laser removal, as is shown in FIG. 11. The contact heads 8 may then either be coated with a solderable coating in a soldering wave bath, or they may be used together with their refined coatings of nickel and/or of gold for ultrasonic bonding.

A solder coating placed on the contact heads 8 is preferably used for enabling the contact heads 8 to contact connection areas of an intermediate carrier which carries the rewiring to external electrical connections that are distributed on an area. The electrical connections are usually contact bumps which are formed from solder balls and project in rows and/or columns on one side of the housing, while the housing carries the semiconductor chip on the other side. The connection of the intermediate carrier with rewiring to the contact heads 8 can also be carried out for a multiplicity of contact heads 8 on a wafer and the separation of this assembly into electronic devices can then take place.

FIG. 12 shows a plan view of a metal sheet 21 patterned with contact spring contours 25. In this embodiment, this metal sheet is the same size as a semiconductor wafer having, for example, 32 semiconductor chips. The metal sheet 21 is between 30 and 100 μm thick and has a multiplicity of contact spring contours 25, the number of which corresponds to the contact areas on the semiconductor wafer. The contact spring contours 25 are etched into the metal sheet 21 or cut into the metal sheet 21 using a laser beam.

FIG. 13 shows an enlarged detail from FIG. 12. This detail is intended to show only in principle the structure of the contact spring contours 25. Such a contour comprises an uncovered end 24, a central region 26 and a desired breaking point 23, with which the contact spring contour 25 is connected to the metal sheet 21. The central region 26 of the contact spring contour tapers toward the desired breaking point, with the result that the cross section with which contact spring contours are suspended from the metal sheet 21 is extremely small and can easily be torn away.

Figure 14:
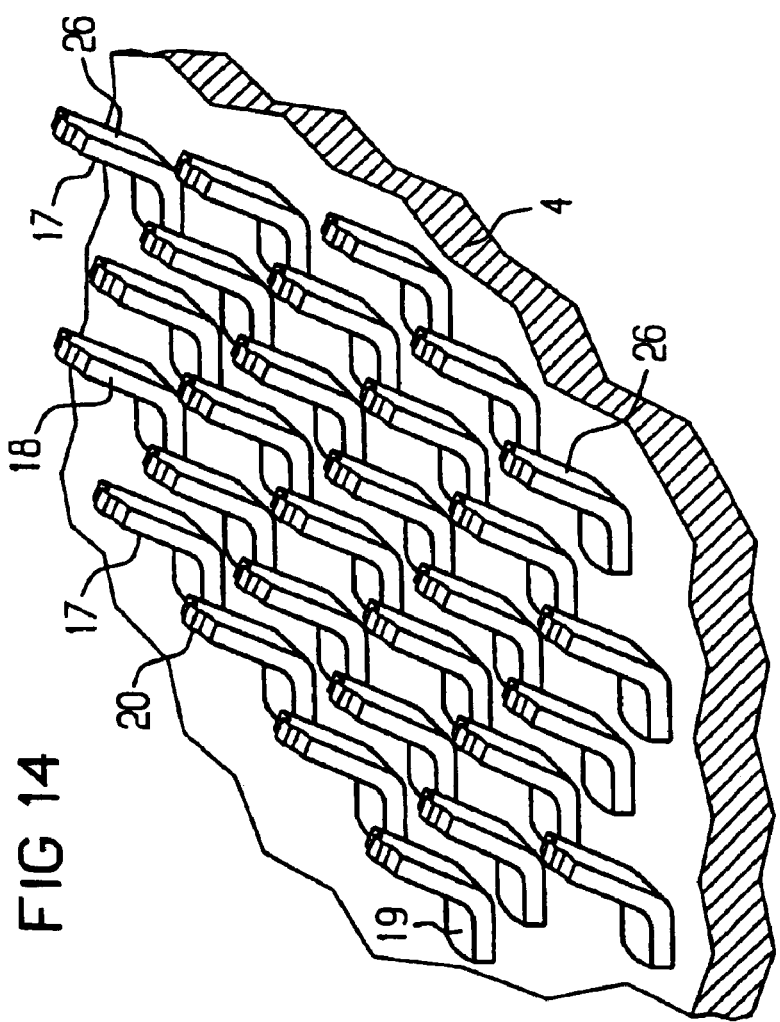
FIG. 14 shows a perspective partial view of an arrangement of a multiplicity of microscopically small contact springs after the metal sheet has been stripped off.

FIG. 14 shows a perspective partial view of an arrangement of a multiplicity of microscopically small contact springs 17 after the metal sheet 21 which is shown in FIG. 12 has been stripped off. It can clearly be seen that the contact spring contours 25, as are shown in FIG. 13, have now been formed into a contact area with a first contact spring end 19, which is fixedly connected on the substrate surface, and a free, second contact spring end 20. To that end, the contact spring contours 25 of FIG. 13 with their uncovered ends 24 have been bonded or soldered onto the contact areas of a substrate, and have subsequently been bent to form contact springs during the tearing-off of the metal sheet 21.

Figure 15:
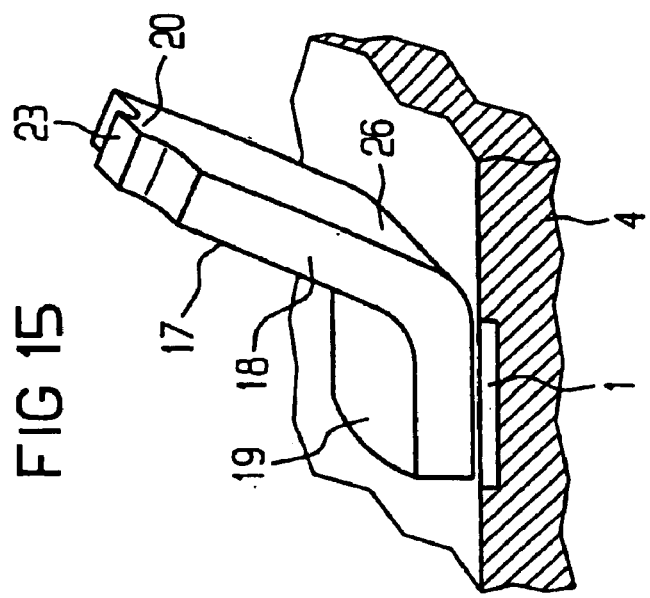
FIG. 15 shows a partial cross-sectional perspective view of a microscopically small contact spring which is connected to a contact area in one piece and integrally.

FIG. 15 shows a partial cross-sectional perspective view of a microscopically small contact spring 17 which is connected to the contact area 1 in one piece and integrally. The contact spring of this exemplary embodiment has the form of a leaf spring which is tapered toward the free end and can be connected by this free end to an intermediate carrier with contact connection areas of a rewiring or can make contact with a test head having correspondingly arranged contact connection areas.

We claim:

1. An electronic device, comprising:
    a substrate being one of a semiconductor chip and a semiconductor wafer having a surface; and
    an electronic circuit having interconnects formed on said surface of said substrate;
    said electronic circuit including at least one microscopically small contact area;
    said contact area including a microscopically small contact element disposed thereon having a base and a substantially straight part integrally connected in one-piece with and at an oblique angle with said base and extending from said contact area in three dimensions in a direction deviating from directions orthogonal to said surface of said substrate and parallel to said electronic circuit on said substrate, said part extending from said contact area being preformed and angularly disposed obliquely relative to said surface of said substrate in an unstressed condition.

2. The electronic device according to claim 1, wherein:
    said electronic circuit includes at least one integrated circuit near said surface of said substrate.

3. The electronic device according to claim 1, wherein said interconnects have ends; and
    said at least one contact area includes a plurality of contact areas, each one of said plurality of said contact areas
    configured on a respective one of said ends of said interconnects.

4. The electronic device according to claim 1, wherein said contact element is elastically deformable.

5. The electronic device according to claim 1, wherein said contact element is pre-bent at a solid angle that deviates from a direction orthogonal to said surface.

6. The electronic device according to claim 1, wherein said surface of said substrate has a largest bulging area with a bulge protruding from said surface and having a length from said surface and said contact element has a length that is at least 5% greater than the length over which the bulge of said largest bulging area protrudes from said surface of said substrate.

7. The electronic device according to claim 1, wherein:
    said substrate has a centrally located neutral point; and
    said contact element has a length that is at least 5% greater than a largest length difference with regard to said centrally located neutral point of the substrate in an event of maximum thermal cycling.

8. The electronic device according to claim 1, wherein said contact area and said contact element are produced from an identical metal alloy.

9. The electronic device according to claim 1, wherein said contact area is produced from an aluminum alloy and said contact element is produced from a gold alloy.

10. The electronic device according to claim 1, wherein said contact area is produced from an aluminum alloy and said contact element is produced from a copper alloy.

11. The electronic device according to claim 1, wherein said contact element is designed as a contact pin.

12. The electronic device according to claim 1, wherein:
    said substrate of the electronic device has a centrally located neutral point;

said contact element has a length that in at least 5% greater than a largest length difference relative to said centrally located neutral point of said substrate in an event of maximum thermal cycling;

said contact area has a shortest linear dimension; and said contact element is designed as a contact pin that has a diameter which is not greater than half of said shortest linear dimension of said contact area.

13. The electronic device according to claim 1, wherein:

said substrate of the electronic device has a centrally located neutral point;

said contact element has a length that is at least 5% greater than a largest length difference relative to said centrally located neutral point of said substrate in an event of maximum thermal cycling;

said contact element is designed as a contact pin having an end with a contact head; and said end of said contact pin is remote from said contact area.

14. The electronic device according to claim 1, comprising:

a coating selected from the group consisting of a nickel coating and a gold coating;

said contact element is designed as a contact pin having an end with a contact head that is coated with said coating; and said end of said contact pin is remote from said contact area.

15. The electronic device according to claim 1, comprising:

a coating made of a solderable metal alloy;

said contact element is designed as a contact pin having an end with a contact head that is coated with said coating; and said end of said contact pin is remote from said contact area.

16. The electronic device according to claim 1, wherein said contact element is designed as a contact pin having an end with a contact head made from solder; and said end of said contact pin is remote from said contact area.

17. The electronic device according to claim 1, wherein said contact area has a shortest linear dimension and said contact element is configured as a contact pin having a diameter which is not greater than half of said shortest linear dimension of said contact area.

18. The electronic device according to claim 1, wherein said part extending from said base has a substantially pin-shaped configuration.

19. The electronic device according to claim 1, wherein said part extending from said base has a free end opposite said base and is configured for detachably receiving a test head.

* * * * *